United States Patent [19]

Davis et al.

[11] Patent Number: 4,816,116
[45] Date of Patent: Mar. 28, 1989

[54] SEMICONDUCTOR WAFER TRANSFER METHOD AND ARM MECHANISM

[75] Inventors: Cecil J. Davis, Greenville; Robert Matthews, Plano; Randall C. Hildenbrand, Richardson, all of Tex.

[73] Assignee: Texas Instruments Incorporated, Dallas, Tex.

[21] Appl. No.: 116,922

[22] Filed: Nov. 3, 1987

Related U.S. Application Data

[60] Division of Ser. No. 60,976, Jun. 12, 1987, abandoned, which is a continuation of Ser. No. 790,708, Oct. 24, 1985, abandoned.

[51] Int. Cl.$^4$ ............................................. B44C 1/22
[52] U.S. Cl. ................................. 156/643; 156/345; 294/28; 414/222
[58] Field of Search .................. 156/643, 646, 345; 427/38, 39; 118/728, 50.1, 620; 204/192.32, 298; 219/121 PG, 121 PM; 414/222, 225, 226, 744 R, 744 A, 744 B; 294/28

[56] References Cited

U.S. PATENT DOCUMENTS

| | | | |
|---|---|---|---|
| 4,550,242 | 10/1985 | Uehara et al. | 219/121 PG |
| 4,584,045 | 4/1986 | Richards | 156/345 |
| 4,586,743 | 5/1986 | Edward et al. | 294/86.4 |
| 4,639,028 | 1/1987 | Olson | 294/34 |
| 4,659,413 | 4/1987 | Davis et al. | 156/345 |

FOREIGN PATENT DOCUMENTS

2171978  9/1986  United Kingdom .

Primary Examiner—William A. Powell
Attorney, Agent, or Firm—Frederick J. Telecky, Jr.; James T. Comfort; Mel Sharp

[57] ABSTRACT

A complete integrated circuit processing module, wherein multiple processing stations, each with its own vacuum isolation, are located inside a single module which is held at hard vacuum. A wafer transport arm mechanism permits interchange of wafers among the processing stations and a load lock. The load lock is equipped to remove and replace wafers from a vacuum-sealed wafer carrier. The wafers remain face-down and under hard vacuum during all the wafers handling steps.

18 Claims, 7 Drawing Sheets

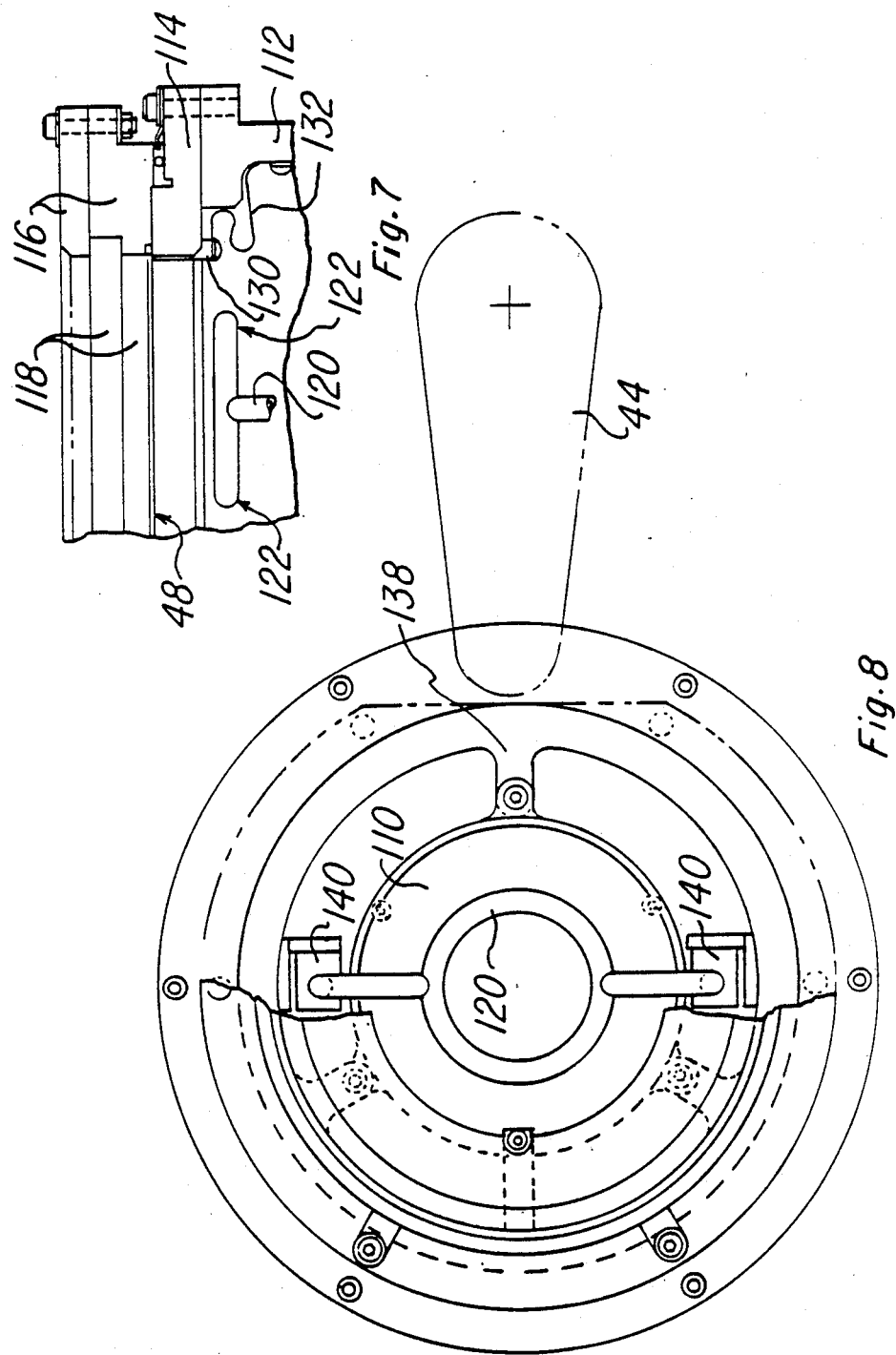

SEMICONDUCTOR WAFER TRANSFER METHOD AND ARM MECHANISM

BACKGROUND AND SUMMARY OF THE INVENTION

The present invention relates to apparatus for manufacturing of integrated circuits.

One of the basic problems in integrated circuit manufacturing is particulates. This problem is becoming more and more difficult, because of two trends in integrated circuit processing: First, as device dimensions become smaller and smaller, it is necessary to avoid the presence of smaller and smaller particles. This makes the job of making sure that a clean room is really clean increasingly difficult. For example, a clean room which is of class 1 (has one particle per cubic foot) for particles of one micron and larger may well be class 1000 or worse if particle sizes down to 100 angstroms are counted.

Second, there is increased desire to use large size integrated circuit patterns: for example, integrated circuit sizes larger than 50,000 square mils are much more commonly used now than they were five years ago.

Thus, particulates are not only an extremely important source of loss in integrated circuit manufacturing, but their importance will increase very rapidly in the coming years. Thus, it is an object of the present invention to provide generally applicable methods for fabricating integrated circuits which reduce the sensitivity of the process to particulate contamination.

One of the major sources of particulate contamination is human-generated, including both the particles which are released by human bodies and the particles which are stirred up by equipment operators moving around inside a semiconductor processing facility (front end). To reduce this, a general trend in the industry for several years has been to make more use of automatic transfer operations, wherein a technician can, for example, place a cassette of wafers into a machine, and then the machine automatically transfers the wafers, one by one, from the cassette through the machine (to effect the processing steps necessary) and back to the cassette, without the technician's having to touch the wafers.

However, the efforts in this direction have served to highlight the importance of a second crucial source of particulates, which is particulates generated internally by the wafers and/or transfer mechanism. That is, when the surface of the wafer jostles slightly against any other hard surface, some particulates (of silicon, silicon dioxide, or other materials) are likely to be released. The density of particulates inside a conventional wafer carrier is typically quite high, due to this source of particulates. Moreover, many of the prior art mechanisms for wafer transport will themselves generate substantial quantities of particulates.

The current state of the art wafer loading mechanisms used in the semiconductor industry consist primarily of three basic types: belt driven wafer transport, air track driven wafer transport, and arm driven wafer transport (using either vacuum coupling or nesting to hold the bottom or the edge of the wafer). However, all of these types of systems typically use face up wafer movement into and out of the carrier, vertical movement of the wafer carrier during the loading and unloading operations, wafer transfer under pressures ranging from atmospheric to low vacuum, and a requirement that wafers be unloaded in the reverse order of loading. The prior art methods accordingly have a number of important disadvantages, as follows.

First, wafers which are transported face up are more likely to catch particles generated by particle generation mechanisms inside the wafer carrier or inside the wafer loader unit.

Second, vertical movement of the wafer carrier during the loading and unloading operation creates many particles, due to rattling of the wafers in the carrier. These particles can fall directly onto the active face of adjacent wafers resting face up in the carrier.

Third, belt mechanisms will typically scrub the bottom of the wafer during loading and unloading operations, again creating many particualtes due to abrasion.

Fourth, air track transport will stir many particulates around by air currents, and many of these particulates can come to rest on the active face of the wafer.

Fifth, the drive mechanisms of many loader modules are housed within the same area as the open wafer carrier will be, in close proximity to the wafers being processed. This has great potential for gross amounts of contamination.

Sixth, the mass of the carrier wafer combination changes as the wafers are loaded and unloaded, and this can affect the reliability and positioning of the wafer carrier vertical drive, particularly where large wafers (such as 150 millimeters or larger) are being handled.

Seventh, two loading modules are typically used for each processing station, so that one cassette is typically progressively loaded, and the wafers from this cassette which have been processed are loaded into a second cassette.

Eighth, loss of equipment utilization efficiency occurs every time a new cassette of wafers is loaded into or out of each processing station, since the machine must be idled while the cassette is removed.

The present invention provides advantageous solutions to all of the above problems, and achieves greatly improved low particulate wafer handling and loading operations.

One key advantage of the present invention is that wafers can be transported, loaded and unloaded without ever seeing atmospheric or even low vacuum conditions. This is extremely useful, because, at pressures of less than about 10 to the $-5$ Torr, there will not be enough Brownian motion to support particulates of sizes larger than about 10 nm, and these particulates will fall out of this low-pressure atmosphere relatively rapidly.

FIG. 2 shows the time required for particles of different sizes to fall one meter under atmospheric pressure. Note that, at a pressure of 10 to the $-5$ Torr ($1E-5$ Torr) or less, even 10 nm particles will fall one meter per second, and larger particles will fall faster. (Large particles will simply fall ballistically, at the acceleration of gravity.) Thus, an aatmosphere with a pressure below 10 to the $-5$ Torr means that particles ten nanometers or larger can only be transported ballistically, and are not likely to be transported onto the critical wafer surface by random air currents or Brownian drift.

The relevance of this curve to the present invention is that the present invention is the first to provide a way to transport wafers from one processing station to another, including loading and unloading steps, without ever exposing them to higher pressures than $1E-5$ Torr. This means that the wafers are NEVER exposed to airborne particles, from the time they are loaded into the first vacuum processing station (which might well be a scrubbing and pumpdown station) until the time when processing has been completed, except where the processing step itself requires higher pressures (e.g. in conventional photolithography stations or for wet processing steps). This means that the total possibilities for particulate collection on the wafers are vastly reduced.

A key element of this advantage is that the present invention provides a method and apparatus for loading and unloading a vacuum carrier under hard vacuum.

The present invention provides a load lock which includes an apparatus for opening a vacuum wafer carrier under vacuum, for removing wafers from the carrier in whatever random-access order is desired, and for passing the wafers one by one through a port into an adjacent processing chamber, such as a plasma etch chamber. Moreover, the load lock of the present invention is able to close and reseal the wafer carrier, so that the load lock itself can be brought up to atmospheric pressure and the wafer carrier removed, without ever breaking the vacuum in the wafer carrier.

A particular advantage of the preferred embodiments of the present invention is that the mechanical apparatus preferably used for wafer transfer is extremely compact. That is, by providing a transfer arm pivoted on an arm support, with gearing or a chain drive inside the arm support so that the rotation of the arm support causes twice as much rotation of the transfer arm with respect to the arm support, a compact apparatus is provided which can rest in the home position and require no more clearance than the length of the arm support in one direction, but can be extended, by a simple rotary shaft motion, out to the length of the arm support plus the length of the transfer arm in either of two directions.

A further advantage of the preferred embodiments of the present invention is that the motors used to extend the transfer arm and to change its elevation are both held inside an exhaust manifold, so that particulates generated by these moving mechanical elements do not tend to reach the interior of the load lock chamber where wafers are exposed.

A further advantage of the invention is that a transfer arm is provided which can handle wafers face down with minimal damage to device areas caused by contact with the transfer arm.

A further advantage of the present invention is that the present invention provides a wafer transfer apparatus which can handle wafers with minimum generation of particulates caused by the handling operation.

A further advantage of the present invention is that the present invention provides a transfer apparatus which can handle wafers with essentially no generation of particulates due to abrasion, since essentially no sliding contacts are made.

Another advantage of the wafer transport mechanism of the present invention is that control is simplified. That is, the transfer arm preferably used has only two degrees of freedom, and position registration is provided so that the transfer arm control can be provided very simply (by use of stepper motors or comparable apparatus), without the need for sensors to detect the position of or forces on the arm.

A related advantage of the wafer transport mechanism of the present invention is that it is a stable mechanical system. That is, small errors in positioning do not accumulate, but are damped out by inherent negative feedback provided by some of the mechanical elements used. This also facilitates the advantage of simple control.

A further advantage of the present invention is that the wafer handling equipment used in the load lock takes up minimum volume. Since the load lock is of such small volume, vacuum cycling can be performed rapidly without requiring very expensive large vacuum pumps.

An even more important consequence of the volume efficiency of wafer transport according to the present invention is that the upper portion of the load lock (wherein the defect-sensitive surfaces of wafers being transferred will be exposed) will therefore have a small surface area. It is desirable to have as little surface area as possible within line-of-sight of the wafer surface, and it is also desirable to have as little surface area as possible in close proximity to the wafer surface, whether it is within line-of-sight or not. All surface area in the upper part of the load lock (i.e. the part above the exhaust manifold) presents two hazards: first, all surface area will desorb gases, so that the more surface area is in the upper chamber the more difficult it will be to pull a hard vacuum. Second and more important, all surface area has the potential to hold adherent particulates, which can later be expelled by mechanical vibration or shock to fly ballistically onto the wafer surface, even under high vacuum. Thus, the volumetric efficiency of the load lock according to the present invention means that the potential for ballistic transport of particulates onto the wafer surface is reduced.

Another advantage resulting from the compactness of the wafer handling equipment in a load lock according to the present invention is that clean room floor space (which is very expensive) is not excessively consumed by such an apparatus.

Another advantage of the wafer carrier described in the present patent application is that this wafer carrier cannot inadvertently be opened outside a clean room. A substantial yield problem in conventional clean room processing is inadvertent or careless exposure of wafers to particulates by opening the wafer carrier outside the clean room environment. However, with the wafer carrier of the present invention this is inherently impossible, since the pressure differential on the door of the carrier holds it firmly shut except when the carrier is in vacuum. This is another reason why the present invention is advantageous in permitting easy transport and storage of wafers outside a clean room environment.

In a further class of embodiments of the present invention, a process module (which may optionally contain one process station or more than one process station) has more than one load lock according to the present invention attached to it. Thus, processing can continue on wafers transferred in from one load lcok while the other load lock is being reloaded. Moreover, the provision of two transfer mechanisms means that, if a mechanical problem occurs with one transfer apparatus inside its load lock, the processing station can continue in production, using transfer through the other load lock, while a technician is summoned to correct the mechanical malfunction. Thus, this class of embodiments has the advantage of greater throughput.

In a further class of embodiments of the present invention, a process module which contains more than one sealable process station incorporates a load lock as described, together with wafer handling equipment inside the process module to transfer wafers received from the load lock wafer handling equipment to any selected one of the process stations. This has the advantage that high lot throughput can be achieved while using single-slice processing techniques and low-particulate high-vacuum handling.

The foregoing arrangement can be used with a great variety of processing modules. However, one particular embodiment, which not only exemplifies generally applicable features of such modules (and the advantages derived therefrom) but also contains numerous specific innovative plasma reactor features (which are also applicable to reactors using more conventional wafer transport, but are particularly advantageous for use with this load lock and wafer transfer arrangement) will be discussed in detail. This sample embodiment is a plasma etching station.

A common problem with prior art plasma etching machines has been particulate generation. Typically plasma etching stations are among the worst stations for deposition of particulates on the sensitive active area of the wafers. One particularly difficult area is the use of "shower head" gas distribution systems, where gas is distributed to the face of the wafer through multiple holes in the face of the active electrode. While this arrangement would seem to to be an attractive way to provide a highly uniform distribution of available process gasses over the face of the wafer, in practice, polymeric or other byproducts of the plasma phase reactions tend to deposit in the holes in the shower head, providing particulates which can be blown through and then immediately deposited on the wafer.

A novel teaching of the present invention is that the flow of gasses to the wafer face should be dominated by diffusion. That is, this aspect of the present invention provides a low-pressure plasma etching (or reactive ion etching) station wherein there is no bulk gas flow over the wafer face. that is, the feed gas species (which are needed for the plasma reactions which will produce the desired ions and free radicals to actually effect etching) are transported into the high-field region close to the face of the plasma (where they will be available for dissociation), not by bulk flow of a gas stream, nor (preferably) even by turbulent eddy currents in a region where there is no overall average bulk flow, but by diffusion. this means that particulate transport by gas-flow-assisted transport to the face of the wafer is greatly reduced.

In a further feature of this plasma reactor, the feed gas distributor is made of an insulating material. The feed gas distributor can thus be positioned reasonably close to the wafer face (i.e. less than one wafer diameter away) to help assure uniform availability of the reaction gasses, but there will not be large potential drop across the dark zone in the plasma immediately adjacent to the feed gas distributor (as there would be if the distributor were made of a conductive material), and thus deposition of polymeric or other plasma reaction products on the feed gas distributor will be reduced. This means that transport of these reaction products to the wafer face as particualtes will also be reduced.

In a further feature of the invention, wafers are etched in a face down position, and a gas distributor is provided which is below the wafer face and has ports blowing away from the wafer. This helps to assure that the bulk gas flow is downward and away from the wafer face, and thus reduces the likelihood of transport of particulates to the wafer face.

A further innovative feature taught by the present application is a plasma (or RIE) reactor for face down etching of wafers, wherein essentially all of the grounded metal reactor chamber walls seen by the plasma move as a unit to open and close the reactor. That is, a vacuum bellows is provided which supports the counter electrode opposite the wafer, and also supports the chamber sidewalls and (preferably) the process gas distribution distributor, so that all of these elements move as a unit. By reducing mechanical movements in proximity to the wafer, generation of particulates thereby is reduced.

The prior art of openable and closeable RIE reactors would typically use complex mechanical actuators, such as feedthroughs or cams, to clamp the wafers in place. However, in the present invention, the only moving mechanical elements are the wafer support pins, which are mounted on (and move only a short distance against the pressure of) an elastic support, so that the process chamber bottom portions can be closed against the powered electrode support when the plasma reactor is sealed to begin plasma etching.

Another innovative feature of this embodiment is that a quartz top layer is provided on the chamber housing, as the layer which will mate to the powered electrode support. This quartz top layer helps to preserve a high area ratio of powered electrode area to ground plane area in the chamber, which provides enhanced ion bombardment on the powered electrode, which is well known to those skilled in the art. This enhanced bombardment is desirable to assist in anisotropic wafer etching. The use of quartz here is further advantageous in that it is transparent to a wide variety of ultraviolet wavelengths, so that optical end point detection, and operator inspection of the plasma etching operation, are both facilitated.

The quartz top layer is also configured to provide excellent uniformity of ion bombardment on the surface of the wafer. That is, the plasma is confined by quartz walls, for several centimeters away from the face of the wafer, to the shape of a cylinder having approximately the same width as the wafer. This collimation of the plasma provides improved uniformity. Quartz walls are particularly well suited for this collimation, since they have less interaction with the plasma than metal walls would.

A further innovative feature of this embodiment is that a light bleed of helium is preferably provided to the back side of the wafer. This helium bleed assures good and uniform thermal contact between the wafer and the powered electrode under vacuum.

According to the present invention there is provided: A wafer processing module comprising: a vacuum-tight processing module chamber; a plurality of process stations inside said module chamber; at least one wafer stage inside said module chamber; a module transfer arm inside said module chamber, said module transfer arm being controllable to transfer wafers to and from said wafer stage and to and from a plurality of said process stations; and at least one load lock abutting said module chamber, said load lock having space therein to hold a wafer carrier, said load lock having a door opener therein, said door opener being controllable to open the door of one of said wafer carriers inside said load lock while said load lock is under vacuum, said load lock being connected to a vacuum pump capable of pulling a vacuum higher than 10 to the -3rd Torr, said load lock also including a transfer arm controllable to remove a desired wafer from the wafer carrier and place the desired wafer on said wafer stage.

According to the present invention there is also provided: A method for fabricating integrated circuits, comprising the steps of: providing a plurality of wafers in a vacuum sealable wafer carrier box; placing said wafer carrier box into a vacuum sealable load lock attached to a process module; pumping down said load lock to a pressure less than 10 to the -4 Torr; opening said wafer carrier and extending a load lock transfer arm into said wafer carrier, to remove a selected one of said wafers therefrom; transferring wafers in a desired sequence from said wafer carrier to one or more selected process stations inside said process module and back until a desired sequence of processing operations has been completed; and then closing said wafer carrier and raising the pressure of said load lock to approximately atmospheric, so that said wafers remain in vacuum inside said wafer carrier while said door of said wafer carrier is held closed by differential pressure.

According to the present invention there is provided: A method for fabricating integrated circuits, comprising the steps of: providing a plurality of wafers in a wafer carrier box, said wafer carrier box having a vacuum sealable door; placing said wafer carrier box into a load lock attached to a process module, said load lock having a vacuum sealable lid; closing said lid and pumping down said load lock to a pressure less than 10 to the −4 Torr; opening said door of said wafer carrier and extending a load lock transfer arm into said wafer carrier, to remove a selected one of said wafers therefrom; transferring wafers in a desired sequence from said wafer carrier to one or more selected process stations inside a process module and back until a desired sequence of processing operations has been completed by selectively elevating and extending said load lock transfer arm toward said wafer carrier to remove or replace wafers from selected slots in said wafer carrier, and away from said wafer carrier, through a port between said load lock and said process module, to transfer wafers between said wafer carrier and a wafer stage inside said process module, and by selectively elevating, extending, and rotating a module transfer arm to selectively transfer wafers among said wafer stage and said process stations; and closing said door of said wafer carrier, closing said port in said adjacent processing chamber, and raising the pressure of said load lock to approximately atmospheric, so that said wafers remain in vacuum inside said wafer carrier and said door of said wafer carrier is held closed by differential pressure; and removing said wafer carrier from said load lock.

BRIEF DESCRIPTION OF THE DRAWINGS

The present invention will be described with reference to the accompanying drawings, wherein:

FIG. 7 shows the plasma reactor of FIG. 6 in the closed position, as it would be during the actual etch process; and FIG. 8 shows a plan view of the reactor of FIG. 6.

DESCRIPTION OF THE PREFERRED EMBODIMENTS

The present invention provides major new concepts in semiconductor processing apparatus. The presently preferred embodiments will now be discussed in great detail, but it must be appreciated that the novel concepts which are included in these embodiments could also be used in many other embodiments, and the scope of the invention is not delimited by the particular examples shown.

Figure 1:
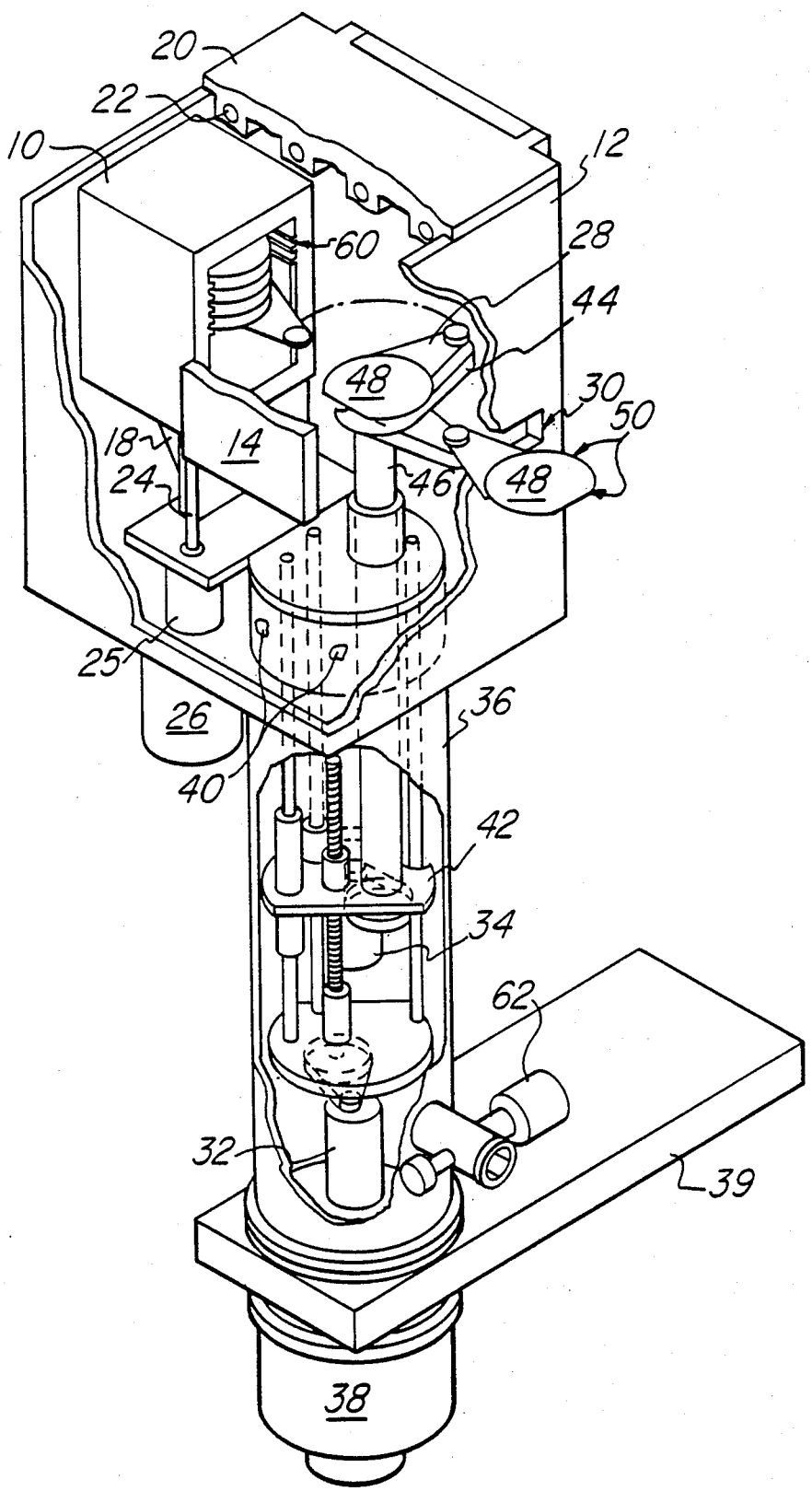
FIG. 1 shows a sample embodiment of a vacuum load lock according to the present invention, with a wafer carrier according to the present invention shown therein in the process of loading and unloading.
Figure 2:
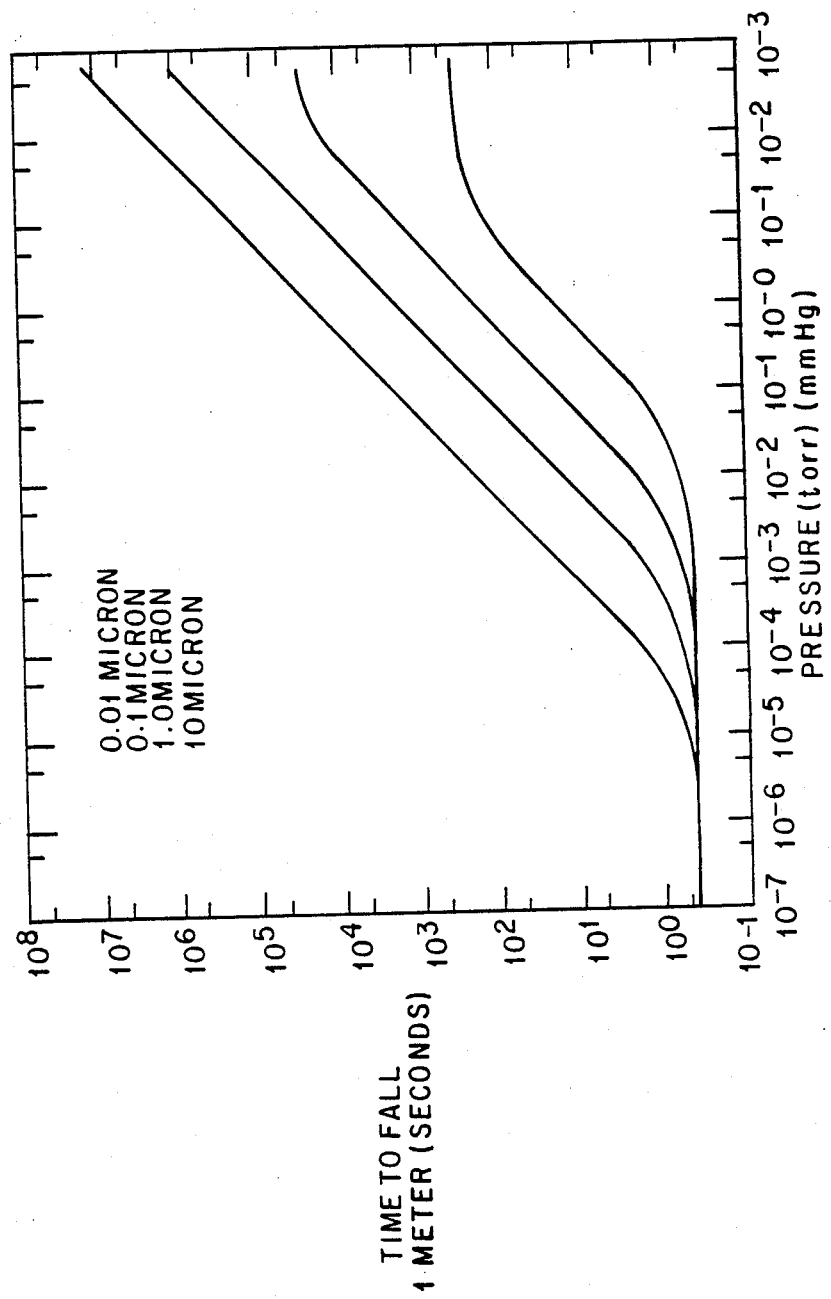
FIG. 2 shows a graph of the time required to fall through air at various pressures for various particulate sizes.
Figure 4:
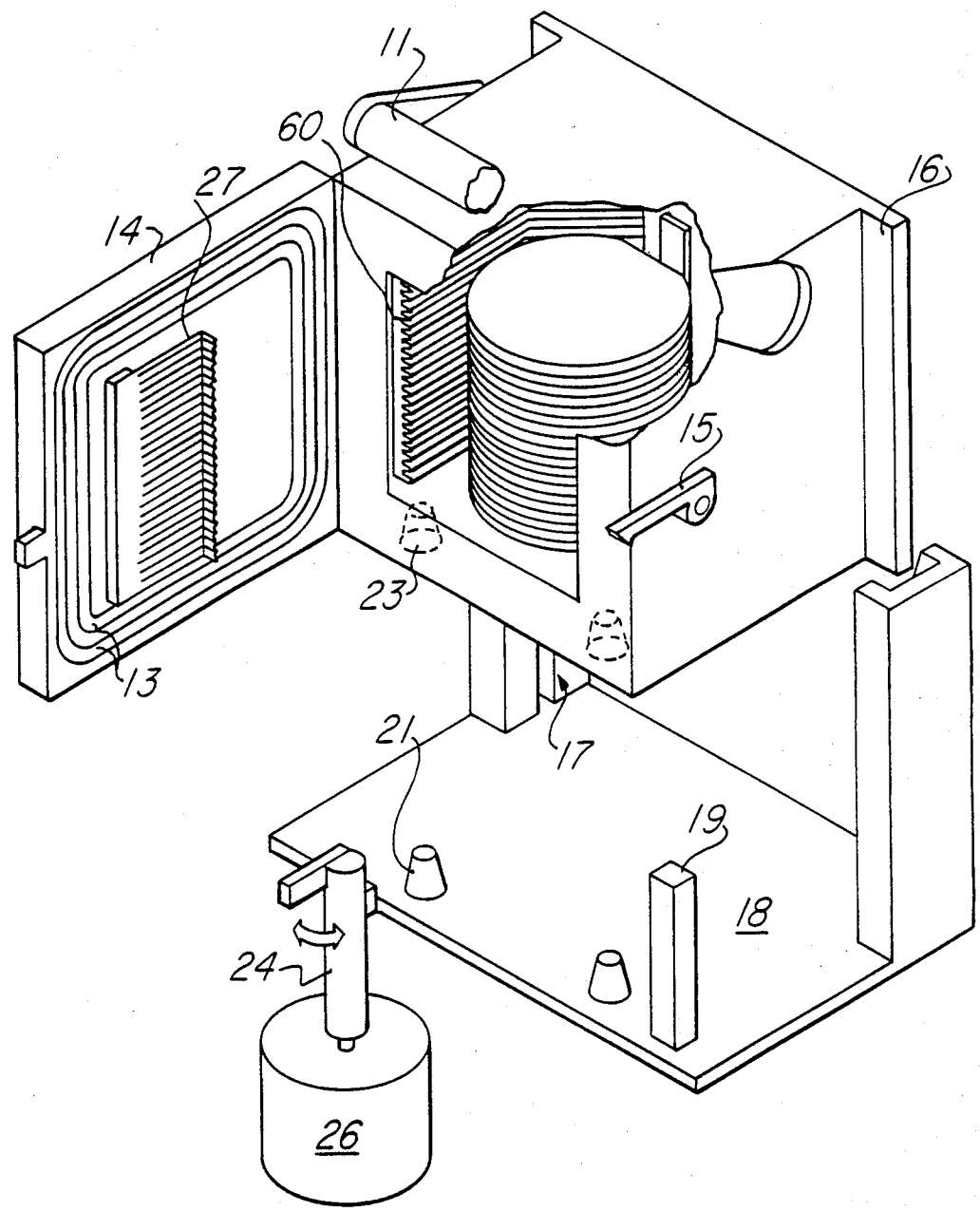
FIG. 4 shows a closer view of a sample embodiment of the wafer carrier 10, docked onto the platform 18 inside the load lock 12 to provide mechanical registration of the position of the wafers.

FIG. 1 shows a sample embodiment of the invention. This embodiment shows a wafer carrier 10 inside a vacuum load lock chamber 12. The wafer carrier 10 is also shown, in slightly greater detail, in FIG. 4.

The carrier 10 is shown with its door 14 standing open. The door 14 preferably has a vacuum seal 13 where it mates with the body of the carrier 10, so that the wafer carrier can be carried around under atmospheric pressure for at least several days (preferably at least several tens of days) without enough leakage to raise the internal pressure above 10 to the −5 Torr.

The wafer carrier 10 is adapted to dock with a platform 18 (which is only partially visible in FIG. 1, but is shown in more detail in FIG. 4), so that, when a technician places a wafer carrier 10 inside the load lock 12, the position of the carrier 10 will be accurately known. In the presently preferred embodiment. the wafer carrier 10 has ears 16 which engage vertical slots 17 fixed to the position registration platform 18, so that the technician can slide the carrier into these slots until it rests on the platform 18, and thereby assure that the position of the carrier 10 is definitely known. In the presently preferred embodiment, the platform 18 includes two tapered pins 21 (one conical and one wedge-shaped) positioned to engage tapered holes 23 in the underside of the wafer carrier 10, but a wide variety of other arrangements could be used to assure mechanical registration, as will be obvious to any ordinarily skilled mechanical engineer.

The carrier 10 preferably has a safety catch 15 on it which secures the door 14 from falling open. However, under normal conditions of transport, this safety catch is not needed, since atmospheric pressure holds the door 14 shut against the internal vacuum of the carrier. When the carrier 10 is placed inside the load lock 12, a fixed finger 19 will push against the safety catch 15 to release it, so that the door 14 can be opened.

When the carrier 10 is docked with the platform 18, the door 14 will also be engaged with the door opening shaft 24. Preferably the door 14 has a shallow groove in its underside, which mates with a finger and arm 25 on the top of the door opening shaft 24. Thus, after the load lock has been pumped down so that differential pressure no longer holds the door 14 closed, the door can be opened by door opening shaft 24.

After the technician has placed the wafer carrier 10 in the vacuum load lock 12 and closed the load lock lid 20, a high pressure purge (with dry nitrogen or other clean gas) is preferably applied through manifold 22 inside load lock lid 20. This high pressure purge provides vertical flow, to tend to transport particles downward, and also helps to blow off some of the large particles which will have collected on the wafer carrier 10 during its exposure to atmospheric conditions. After this initial purge stage (e.g. for 30 seconds or more), the chamber is then slowly pumped down to 10 to the −4 Torr or less. This pump down stage is preferably relatively slow, in order not to stir up random particulates. That is, while low pressures do permit particles to fall from the air, those particles will still be available on the bottom of the chamber, and must not be stirred up if this can be avoided.

In order to make sure that the airborne particulates have actually fallen out of the chamber air, the interior of the vacuum load lock will then preferably be allowed to stay at 10 to the −4 or 10 to the −5 Torr for a few seconds, to make sure that all of the particles which are able to fall out of the air will do so.

It may also be advantageous, zas an optional modified embodiment of the invention, to use a sloped bottom and/or polished sidewalls for the load lock, to reduce the population of particulates sticking to the sidewalls and bottom which can be sent flying by mechanical vibration. The present invention greatly reduces the problems of airborne particulates, which has always been the dominant type of particulate transport, so that the problem of ballistically transported particulates can now be usefully addressed. A related optional modification is the use of an insitu vacuum particle counter in the upper chamber, so that any increase in particle population in the critical volume can be detected. Such an in-situ particle counter can be built using a resonant circuit to measure charge transfer in a high-voltage vacuum-gap capacitor, or (for particles sufficiently large) by using a laser-driven optical cavity with a multiply-folded optical path, or by other means.

Optionally, this particulate sensor (or a second particulate sensor which is better adapted to sensing particulates at higher pressures) can be used to control the nitrogen shower prior to initial pumpdown. That is, instead of doing the nitrogen shower simply for a fixed duration, it may be protracted if the particulate monitor shows that the box was in an unusually dirty environment. It may even be desirable to pump the load lock down to a soft vacuum (using the roughing pump) and then bleed gas through the nitrogen shower ports, to create a downward flow. It may also be desirable to cycle the load lock from a soft vacuum (e.g. 100 milli-Torr or so) up to atmospheric again, by initiating another nitrogen shower cycle, if the particulate monitor indicates that that particulate level is still excessive at the time the load lock has reached a given soft vacuum pressure.

Note that vacuum gauges 62 are preferably connected to the interior of the load lock chamber. Preferably the sensors 62 include a high-pressure gauge (such as a thermocouple), a low pressure gauge (such as an ionization gauge), and a differential sensor which accurately senses when the load lock interior pressure has been equalized with the atmosphere. Thus, the door of a carrier 10 is not opened until these gauges indicate that a good vacuum has been achieved inside the load lock.

After a roughing pump (not shown) has brought the chamber down to a soft vacuum, the gate valve 39 can be opened to connect the turbomolecular pump 38 to the interior of the load lock, and the turbomolecular pump 38 can then be operated to bring the pressure down to 10 to the −5 Torr or less.

At this point, the pressures inside the wafer carrier 10 and the vacuum load lock 12 are more or less equalized, and the door 14 can be activated by operating motor 26, which is connected to door opening shaft 24 through vacuum feedthrough 25.

Preferably two sensor switches are also included inside vacuum load lock 12, to ascertain when door 14 is in its fully opened position, and when door 14 is fuly shut. Thus, after the load lock 12 has been pumped down and allowed to sit for a few seconds, door opening shaft 24 is rotated to open the door 14, until the sensor detects that the door is fully open. During this time, the transfer arm 28 is preferably kept in its home position at an elevation below the bottom of the door, so that the door 14 has clearance to open. After the sensor detects that the door 14 is fully open, the transfer arm can begin to operate.

The transfer arm 28 preferably has two degrees of freedom. One direction of motion permits the transfer arm 28 to reach into carrier 10 or through port 30 into the adjacent processing chamber. The other degree of freedom corresponds to vertical motion of the transfer arm 28, which permits selection of which wafer inside the carrier 10 is to be removed, or which slot a wafer is to be placed into.

In the presently preferred embodiment, an elevator drive motor 32 is used to control the elevation of the transfer arm 28, and arm drive motor 34 controls the extension and retraction of the transfer arm 28. Note that both of these motors, in the presently preferred embodiment, do not require vacuum feedthrough, but are housed inside the exhaust manifold 36 which leads from the load lock 12 to the vacuum pump 38, which may be, for example, a turbo molecular pump. Moreover, the exhaust manifold 36 does not open directly into the load lock chamber 12, but instead has apertures 40 around its top. That is, the exhaust manifold 36 is preferably configured so that there is not any line of sight path from the drive motors 32 or 34 or from the pump 38 into the load lock chamber. This helps to reduce ballistic transport of particulates from these moving elements into the load lock chamber.

The elevator drive motor 32 is preferably connected to drive a sub-platform 42 up and down, and the arm drive motor 34 is preferably mounted on this platform 42.

In the presently preferred embodiment, a linkage is used inside the rotatable transfer arm support 44, to permit the transfer arm 28 to move very compactly. The transfer arm support 44 is preferably connected to a rotating rod which is driven by the arm drive motor 34, but the arm support 44 is preferably mounted on a tubular support 46 which does not rotate. An internal chain and sprocket linkage is preferably used so that the joint between arm support 44 and transfer arm 28 moves with twice the angular velocity of the joint between arm support 44 and tubular support 46. (Of course, many other mechanical linkages could alternatively be used to accomplish this.) This means that, when the arm support 44 is in its home position, a supported wafer 48 will be approximately above the tubular support 46, but when the arm support 44 is rotated 90 degrees with respect to the tubular support 46, the transfer arm 28 will have been rotated 180 degrees with respect to the arm support 44, so the transfer arm can either extend straight into the wafer carrier 10 or else straight through the port 30 into the adjacent processing chamber. This linkage is described in greater detail in U.S. patent application Ser. No. 664,448, filed 10/24/84 (TI-10841), which is hereby incorporated by reference.

The transfer arm 28 preferably is a thin piece of spring steel, e.g. 0.030 inch thick. The transfer arm has 3 pins 50 on it to support the wafer. Each pin 50 preferably includes a small cone 52 on a small shoulder 54. The cone 52 and shoulder 54 are preferably made of a material which is soft enough to not scratch silicon. In the presently preferred embodiment, these portions (which are the only portions of transfer arm 28 which will actually touch the wafers being transported) are preferably made of a high-temperature plastic (i.e. a plastic with a relatively low propensity to outgas under vacuum) such as Ardel (a thermoplastic phenyl acrylate, made by Union Carbide) or Delrin. Note that the use of cones 52 at the center of the locating pins 50 permits very slight misalignments of the wafer to the transfer arm 28 to be corrected: in other words the system of wafer transport according to the present invention is a stable mechanical system, wherein small misalignments during successive operations will not accumulate, but will be damped out.

Note that, in the positioning of the wafer 48 as shown, one of the three pins 50 rests against the flat portion 56 of the wafer's circumference. This means that, in this embodiment, the three pins 50 on the transfer arm 28 do not define a circle of the same diameter as the diameter of the wafers 48 to be handled.

To assure that the wafer flats 56 do not interfere with accurate handling of the wafers, the box 10 preferably has a flat surface on its interior back side which the flats 56 of the wafers 48 will rest against. A spring compression element on the inside surface of the door 14 pushes each wafer against this flat surface when the door 14 is closed, so that the wafers do not rattle around in transit. This also assures that, when the door 14 is opened, the location of the flat 56 on each wafer 48 is accurately known.

Thus, after the box 10 is in the chamber 12 with its door 14 open, elevator drive motor 32 is operated to bring the transfer arm 28 to just below the height of the first wafer which it is desired to remove, and arm drive motor 34 is then operated to extend the transfer arm 28 into the interior of the box 10. By operating the elevator drive motor 32 briefly, the transfer arm 28 is then raised, in this position, until the three pins 50 around its circumference lift the desired wafer off of the ledges 60 on which it has been resting inside the carrier box 10.

Note that the ledges 60 preferably have tapered surfaces rather than flat surfaces, so that contact between the ledges 60 and the wafer 48 resting on them is a line contact rather than an area contact, and is limited to the edge of the wafer. That is, in prior art wafer carriers area contact may be made over a substantial area, of many square millimeters, but the "line contact" used in the present invention makes contact only over a much smaller area, typically of a few square millimeters or less. An alternative definition of the "line contact" used in this embodiment of the invention is that the wafer support contacts the surface of the wafer only at points which are less than one millimeter from its edge.

Thus, by raising the transfer arm 28, the desired wafer 48 will be picked up, and will be resting on the cones 52 or shoulders 54 of the three pins 50 on the transfer arm 28.

In the presently preferred embodiment, the ledges 60 have a center-to-center spacing of 187 inches inside the box. This center spacing, less the thickness of the wafers, must allow clearance enough for the height of the transfer arm 28 plus the pins 50, but need not be much more. For example, in the presently preferred embodiment, the transfer arm is about 0.080 inch thick, including the height of the cones 52 on the transfer pins 50. The wafers themselves will be about 0.021 inch thick (for the presently preferred embodiment wherein 4 inch wafers are used) so that about 0.085 inch clearance is available. Of course, larger diameter wafers will have greater thicknesses, but the present invention is eminently suited to such larger diameter wafers, since the size of the box 10 and the center spacing of the ledges 16 inside the box 10 can simply be scaled appropriately.

Thus, after the transfer arm 28 has picked up a desired wafer 48, the arm drive motor 34 is operated to bring the transfer arm 28 to the home position The elevator drive motor 32 is then operated to bring the transfer arm 28 to a height where it can reach through the port 30.

Figure 3:
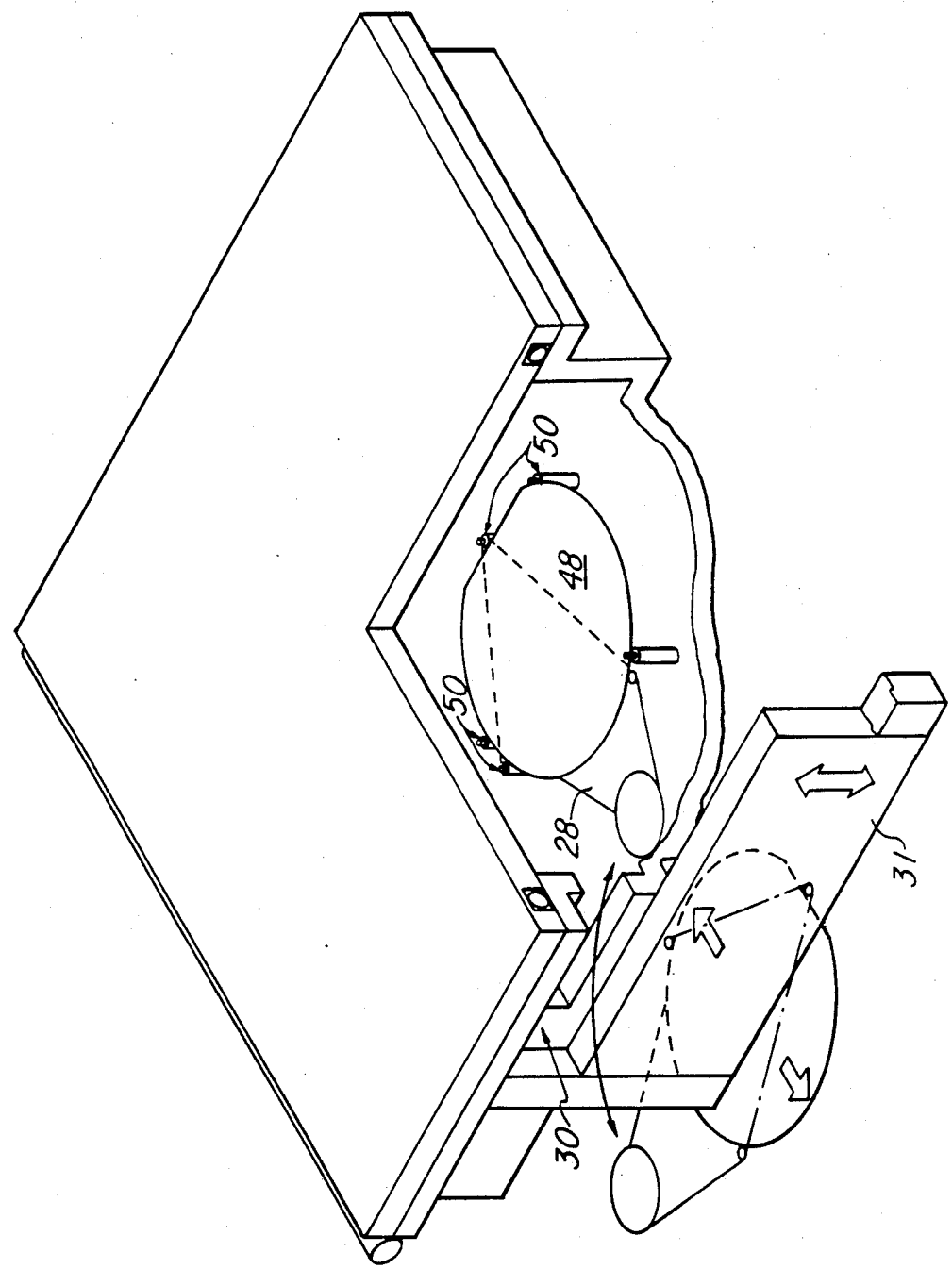
FIG. 3 shows a sample wafer transfer structure, in a processing station, wherein the wafer is placed onto three pins by the transfer arm 28 reaching through the port 30 from the adjcent load lock 12.

Port 30 is preferably covered by an isolation gate 31 unlike the gate 31 shown in FIG. 3: the gate 31 preferably seals the port 30 without making sliding contact. (Again, the absence of sliding contact is advantageous to reduce internally generated particulates.)

In the present embodiment, the isolation gate 31 over port 30 is preferably operated by an air cylinder, but a stepper motor may be used instead. Thus, a total of four motors are used: two which use vacuum feedthroughs, and two which are preferably contained inside the exhaust manifold 36.

The arm drive motor is now operated again, to extend the transfer arm 28 through port 30 into the adjacent processing chamber.

The adjacent processing chamber may be any one of many different kinds of processing stations. For example, this station may be an implanter, a plasma etch, or a deposition station.

In the presently preferred embodiment, the transfer arm reaching through the port 30 will place the wafer 48 on three pins 50, as shown in FIG. 3, like those used in the transfer arm itself. (Note that the port 30 preferably has enough vertical height to permit some vertical travel while the arm 28 is extended through port 30, so that arm 28 can move vertically to lift a wafer from or deposit a wafer onto pins 50 inside the processing chamber.)

Alternatively, the processing chamber may include a fixture having spaced sloped ledges like the ledges 16 inside the transfer box, or may have other mechanical arrangements to receive the wafer. However, in any case, the arrangement used to receive the transferred wafer must have clearance on the underside of the wafer (at least at the time of transfer), so that the transfer arm 28 can reach in on the underside of the wafer to emplace or remove it. If pins 50 are used to receive the transferred wafer, it may be desirable to provide a bellows motion or a vacuum feedthrough in order to provide vertical motion of the wafer support pins inside the processing chamber. Thus, for example, where processing chamber is a placma etch or RIE (reactive ion etch) station, a feedthrough may be provided to position the wafer 48 onto a susceptor after the transfer arm 28 has been withdrawn out of the way of the wafer.

Of course, the processing chamber may be an engineering inspection station. A vacuum-isolated microscope objective lens will permit inspection of wafers in vacuum and (using an appropriately folded optical path) in a face-down position. This means that heavy use of engineer inspection can be made where appropriate, without the loss of engineer time and clean-room quality which can be caused by heavy traffic through a clean-room.

In any case, the transfer arm 28 is preferably withdrawn, and the isolation gate over port 30 closed, while processing proceeds. After processing is finished, the isolation gate over port 30 is opened again, the arm 28 is extended again, the elevator drive motor 32 is operated briefly so that the arm 28 picks up the wafer 48, and the arm drive motor 34 is again operated to bring the transfer arm 28 back into the home position. The elevator drive motor 32 is then operated to bring the transfer arm 28 to the correct height to align the wafer 48 with the desired slot inside the wafer carrier. The arm drive motor 34 is then operated to extend the transfer arm 28 into the wafer carrier 10, so that the wafer 48 which has just been processed is sitting above its pair of ledges 60. The elevator drive motor 32 is then briefly operated to lower the transfer arm 28, so that the wafer is resting on its own ledges 60, and the arm drive motor 34 is then operated to retract the transfer arm 28 to home position. The sequence of steps described above is then repeated, and the transfer arm 28 selects another wafer for processing.

Note that, with the mechanical linkage of the transfer arm 28 and arm support 44 described above, the wafers being transferred will move in exactly a straight line if the center to center lengths of transfer arm 28 and arm support 34 are equal. This is advantageous because it means that the side of the wafer being transferred will not bump or scrape against the sides of the box 10 when the wafer is being pulled out of or pushed into the box. That is, the clearances of the wafer carrier box can be relatively small (which helps to reduce particulate generation by rattling of the wafers during transport in the carrier) without risking particulate generation due to abrasion of the wafers against the metal box sides.

Processing continues in this fashion, wafer by wafer, until all the wafers inside the carrier 10 (or at least as many of them as desired) have been processed. At that point the transfer arm 28 is returned empty to its home position and lowered below the lower edge of the door 14, and the isolation gate over port 30 is closed. The door opening shaft 24 is now rotated to close door 14, and provide initial contact for the vacuum seals between door 14 and the flat front surface of carrier 10, so that the carrier is ready to be sealed (by pressure differential) as the pressure inside the load lock is increased. The load lock 12 can now be pressurized again. When the differential sensor of the vacuum gauge 62 determines that the pressure has come up to atmospheric, the load lock lid 20 can be opened and the wafer carrier 10 (which is now sealed by differential pressure) can be manually removed. In the preferred embodiment, a folding handle 11 is provided on the top side of the carrier, to assist in this manual removal without substantially increasing the volume required for the carrier inside the load lock.

After the carrier has been removed, it can be carried around or stored as desired. The seals 13 will maintain a high vacuum in the carrier meanwhile, so that particulate transport to the wafer surfaces (and also adsorption of vapor-phase contaminants) is minimized.

Note that the wafer carrier also includes elastic elements 27 mounted in its door. These elastic elements exert light pressure against the wafers 48 when the door 14 is closed, and thus restrain them from rattling around and generating particulates. The elastic element 27 is configured as a set of springs in the embodiment shown, but other mechanical structures (e.g. a protruding bead of an elastic polymer) could alternatively be used to configure this. Where the wafers used have flats, a flat contact surface 29 is preferably provided on the inner back surface of the wafer carrier box 10 for the slice flats to be pressed against.

Note also that the ledges 60 on the sidewalls of the carrier box 10 are tapered. This helps to assure that contact with the supported surface of the wafer is made over a line only, rather than over any substantial area. This reduces wafer damage and particulate generation during transport. This also assists in damping out the accumulation of positioning errors, as discussed.

The load lock lid 20 preferably has a window in it, to permit operator inspection of any possible mechanical jams.

An advantage of the present invention is that, in the case of many possible mechanical malfunctions, the door of the wafer carrier 10 can be closed before attempts are made to correct the problem. For example, if somehow the transfer arm 28 picks up a wafer so that the wafer is not sitting properly on all three of the pins 50, the door drive motor 26 can be operated to close the door 14 before any attempts are made to correct the problem. Similarly, port 30 can be closed if the transfer arm 28 can be retracted into home position. It may be possible to correct some such mechanical misalignment problems simply by deviating from the normal control sequence. For example, the position of a wafer 48 on transfer arm 28 may in some cases be adjusted by partially extending the transfer arm 28, so that the edge of wafer 48 just touches the outside of door 14, or of the isolation gate over port 30. If this does not work, the load lock 12 can be brought back up to atmospheric pressure (with the door 14 of wafer carrier 10 closed) and the load lock lid 20 opened so that the problem can be manually corrected.

Note that all of the operations described above can be very easily controlled. That is, no servos or complex negative feedback mechanisms are needed. All four of the motors described are simple stepper motors, so that multiple stations according to the present invention can be controlled by a single microcomputer. The mechanical stability of the system as a whole i.e. the inherent correction of minor positioning errors provided by the tapered pins of the wafer supports, by the slope of the wafer support ledges in the wafer carrier, and by the flat on the backwall of the wafer carrier—helps to prevent accumulation of minor errors, and facilitates easy control.

This advantage of simple control is achieved in part because good control of mechanical registration is achieved. As noted, the docking of the carrier 10 with platform 18 provides one element of mechanical registration, since the location of the platform 18 with respect to the transfer arm 28 can be accurately and permanently calibrated. Similarly, the wafer carrier 10, do not need to be controlled on each dimension, but merely need to be controlled so that the location and orientation of the support shelves 60 are accurately known with respect to the bottom (or other portion) of the box which mates with support platform 18. As described above, this is preferably accomplished by having channels which the wafer carrier slides into until it rests on the platform 18, but many other mechanical arrangements could be used instead.

Similarly, mechanical registration must be achieved between the home position of the transfer arm 28 and the support pins 50 (or other support configuration) which the wafer will be docked to inside the processing chamber. However, this mechanical registration should be a simple one-time setup calibration.

Note that angular positioning will be preserved by the box itself: as was noted, whenever the door 14 is closed, spring elements inside it will press the wafers 48 against the flat on the interior back surface of the box.

Optionally, the wafer carrier 10 could be provided with a quick-connect vacuum fitting, to permit separate pumpdown on the carriers 10. However, in the presently preferred embodiment this is omitted, since it is not necessary and since it simply provides another source of possible unreliability.

Note that the load lock mechanism described need not be used solely with vacuum-tight wafer carriers, although that is the most preferred embodiment. This load lock can also be used with wafer carriers which carry atmospheric pressure inside. Although this is not the most preferred embodiment, it still carries substantial advantages, as is discussed above, over prior art load lock operations.

It should be noted that a wafer carrier as described can be made in different sizes, to carry any desired number of wafers. Moreover, a wafer carrier according to the present invention can be used to carry or store any desired number of wafers, up to its maximum. This provides additional flexibility in scheduling and process equipment logistics.

Figure 5:
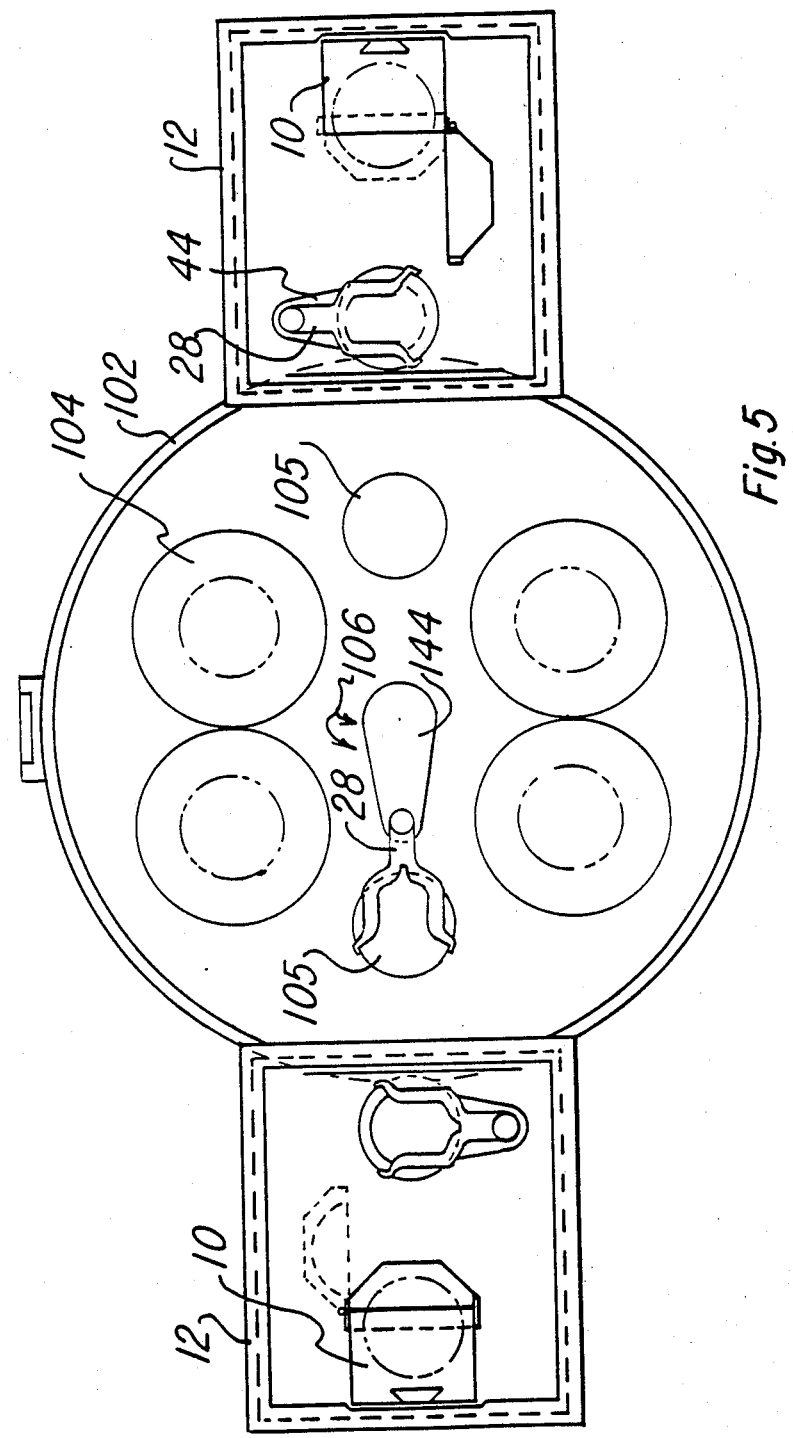
FIG. 5 shows a plan view of a sample processing module, containing four process stations and two wafer transfer stages, and a load lock adjacent to each of the wafer transfer stages.

FIG. 5 shows a sample further alternative embodiment wherein two load locks, each containing a wafer carrier 10, are both connected to a process module 102 which contains four process stations 104. When the transfer arm 28 reaches through the port 30 from a load lock 12 into the process module 102, it places its wafer onto one of two wafer stages 106. These wafer stages 106, as discussed above, can be three pin supports or two ledge supports, or may have other mechanical configurations that would be obvious to those skilled in the art, as long as there is space underneath the supported wafer for the transfer arm 28 to lower free of the wafer and retract after it has placed the wafer on the supports. (It is preferable however, that the wafer support used be such as to make line contact, rather than contact over any substantial area, to the under surface of the wafer.)

Another transfer arm assembly 106 is provided inside the process module. This transfer arm assembly is generally similar to the transfer arm assembly 28, 44 and 46 used inside the load lock, but there are some differences. First, the transfer arm 28 used inside the load lock only needs to move wafers in a straight line. By contrast, the transfer arm assembly 106 must also be able to move radially, to select any one of the process modules 104. Thus, an additional degree of freedom is needed. Second, the reach of the transfer arm assembly 106 need not be the same as the transfer arm assemblies (28,44,46) used inside the load lock, and in fact the reach of transfer arm 106 is preferably larger, to permit adequate spacing of the process stations 104. Third, the arm assembly 106 does not need as much travel in elevation as the transfer arms 28 used in the load locks. Fourth, in the configuration shown, the transfer arm 128 will not have one of its three pins 50 resting on a wafer flat, so that the diameter of the circle defined by pins 50 is not the same for arms 28 and 128, even though they are handling wafers of the same diameter.

The transfer arm assembly 106 is preferably essentially the same as the transfer arm assembly (28,44,46) used in the load lock, with these differences. By making the tubular support 46 rotatable and providing a third motor to drive this rotation, a third degree of freedom for the transfer arm is provided. Similarly, the dimensions of the transfer arm can simply be scaled as desired. Thus, transfer arm assembly 106 preferably includes a transfer arm 128 rotatably mounted on a transfer arm support 144. The transfer arm support 144 is pivotably mounted to a tubular support 146 (not shown), and an internal shaft, fixed to the transfer arm support 144, extends down through the tubular support 146. An internal chain drive with two to one gearing translates any differential rotation between tubular support 146 and arm support 144 into a further differential rotation (over twice as many degress) between arm support 144 and transfer arm 128. An arm drive motor, mounted below the transport assembly 106, is connected to rotate the shaft which is fixed to arm support 144. An arm rotation motor is connected to rotate the tubular support 146. Finally, an elevator mechanism provides vertical motion of the transfer arm assembly 106.

Note that the vertical motion required of assembly 106 is not typically as much as that required of the transfer arms 28 in the load locks 12, since the transfer arm 128 will typically not need to select one of several vertically separated wafer positions like those in the wafer carrier 10, but will typically merely be used to pick and place wafers from a number of possible wafer stations which are all on the same plane. Thus, optionally the vertical elevation of the transfer 128 could be controlled by an air cylinder rather than by an elevator motor assembly as discussed above.

Thus, by rotating tubular support 146 simultaneously with the arm support 144, the transfer arm assembly 106 can be rotated without being extended. After the arm assembly 106 has been rotated to the desired position, the tubular support 146 can be held fixed while the arm support 144 is rotated, and this will cause the transfer arm 128 to extend as described above.

Thus, after transfer arm 28 from one of the load locks 12 has placed a wafer to be processed on one of the wafer stages 106, the transfer arm assembly 106 is rotated (if necessary), extended at a low position so that transfer arm 128 comes underneath the wafer, elevated so that transfer arm 128 picks up the wafer, and retracted to its home position. The assembly 106 is then rotated again, and the transfer arm 128 is extended, so that the wafer is now located above a wafer support in one of the process stations 104, or above the other wafer stage 106. By lowering the arm assembly 106, the wafer can now be placed on the wafer support or wafer transfer stage, and the arm 128 can now be retracted.

The process station 104 can now be sealed off from the main process module 102, and separate single-wafer processing of the wafer can begin. Meanwhile, the transfer arms 128 and 28 can perform other operations. When a wafer in a module 104 has completed processing, that process station 104 can then be pumped down to the same low pressure as the interior of process module 102, and process station 104 can be opened. The transfer arm assembly 106 can now be operated to remove this wafer, and transfer it either to one of the wafer stages 106 or to another one of the process modules 104.

One advantage of the present invention is that the process modules 104 can all be configured to do the same operation, which will permit wafer transport-limited throughput (even for fairly slow processing operations, if there is a sufficient number of process stations 104 in the process module 102; or, alternatively, different operations can be used in different ones of the process stations 104.

That is, the present invention permits the use of sequential processing, which is increasingly recognized as desirable, since processing variations caused by adsorbed contaminants or by native oxide are eliminated. For example, two of the process stations 104 can be configured for oxide growth, one for nitride deposition, and one for poly deposition, to permit complete in-situ fabrication of oxynitride poly-to-poly capacitors. Moreover, the provision of different process steps in the different stations 104 means that many lot splits and process variations can be performed simply by programming the appropriate operations, without relying on technicians to correctly identify which wafers should go to which machines. Thus, the capability to have different operations proceed in different ones of the process stations 104 provides additional processing flexibility.

Note also that the overall wafer transfer sequence is completely arbitrary, and may be selected as desired. For example, the wafers from one wafer carrier 10 could be completely processed and returned to that wafer carrier 10, and the load lock 12 containing the just-processed wafers could be sealed off from process module 102, so that the wafers in the other wafer carrier 10 in the other load lock 12 could be processed while a technicial removed the carrier full of processed wafers from the other load lock 12. Alternatively, the programmability and random access of this arrangement could be used to shuffle and interchange wafers between the two carriers 10 in whatever fashion desired.

It should also be noted that this arrangement is not at all limited to two load locks 12 nor to four process stations 104, but the arrangement described can be scaled to other numbers of process stations 104 in a module 102, or other numbers of load locks 12 attached to a module 102, or to use of more than one tranfer arm assembly 106 inside a module, if desired.

Note that this arrangement still preserves wafer orientation. Assuming that wafers are carried in carrier 10 with their flats toward the back of carrier 10, they will be placed on wafer stage 106 with their flats toward the center of module 102. Transfer arm 106 will preserve this orientation, so that, when flats are replaced in either wafer carrier 10, they will have their flats toward the back of the box.

Figure 6:
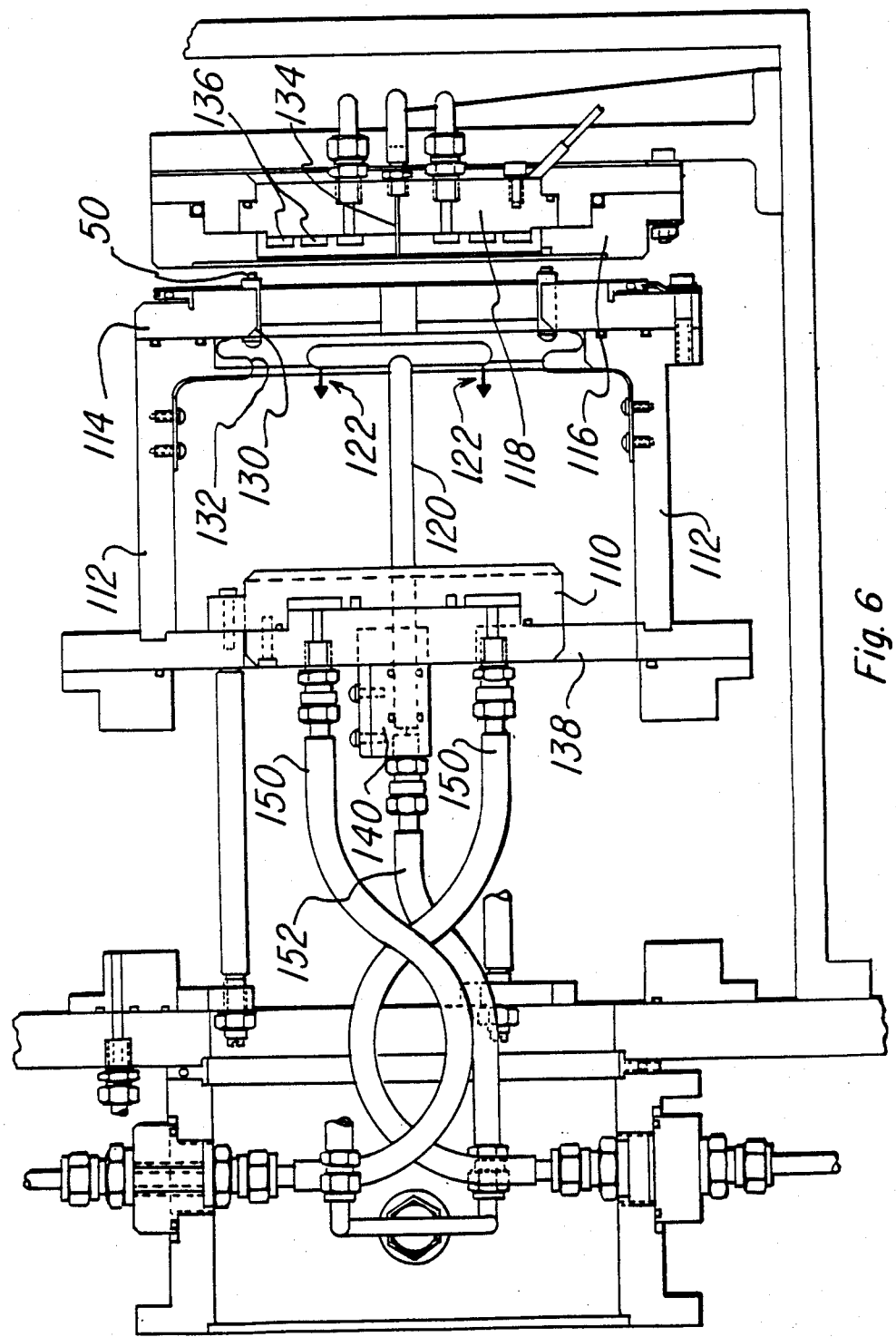
FIG. 6 shows a sample configuration for a processing module, which can be used as one of the processing modules inside the processing station shown in FIG. 5.

FIG. 6 shows a sample process station 104, which can be used in a structure such as shown in FIG. 5.

FIG. 6 shows a single slice reactor which can be used for reactive ion etching or for plasma etching. As discussed above, the transfer arm 128 places a wafer onto tapered Ardel pins 50, and then retracts. At this point the whole lower assembly, including the chamber 112, ground electrode 110, gas distributor 120, base plate 138, and top plate 114 are moved upward, using, e.g., an air cylinder or a vacuumn feed through (not shown). A bellows 124 permits this vertical motion to occur while maintaining a vacuum-tight interface to the interior of the module 102. This vertical motion causes the backside of the wafer resting on pins 50 to make contact with the powered electrode 118, and at this point the sliding pin supports 130 which are attached to the underside of the tapered pins 50 retract slightly against a leaf spring 132. (Other elastic elements could be used in place of leaf spring 132, to assure a small amount of give in the pin supports 130, so that the wafer is not pressed against the powered electrode 118 with too much force.)

The last portion of the upward travel of this assembly causes the seal 134 to make closure between the quartz plate 114 at the top of the chamber 112 and the quartz plate 116 which surrounds the powered electrode 118. Thus, when the seal is made, the interior of this process chamber is vacuum-sealed from the interior of the process module 102.

A helium bleed port 134 is provided to connect a helium supply to the back of the wafer. This helium space means that the space between the low points of the powered electrode 118 and the wafer will be filled with helium, rther than vacuum, and this assure a reasonably low-thermal-resistance and highly repeatable thermal contact between the wafer and the powered electrode 118. Powered electrode 118 preferably includes coolant manifold spaces 136, to which coolant can be supplied.

In an alternative embodiment of the present invention, the tapered pins 50 are not mounted on sliding pin supports 130 supported by elastic elements 132, but are fixed. Since the helium bleed 134 assures good thermal contact between the back side of the wafer and the surface of the powered electrode 118, a tolerance of several thousands of an inch will still permit good rf coupling of the electrode 118 to the wafer, and still permit good thermal contact between the electrode 118 and the wafer. A tolerance of this magnitude should provide enough allowance for thermal expansions of chamber walls, variation in seal thickness, variation in wafer thickness, etc., to still permit reliable sealing of the lower chamber portion to the upper portion. Note that, in this embodiment, the quartz faces 114 and 116 would preferably be shaped slightly differently, to minimize the lateral spread of the plasma adjacent to the face of the wafer. However, the presently preferred embodiment does use sliding pin supports 130, since they permit the quartz piece 114 to confine the plasma closely near the face of the wafer 48 as shown in FIG. 7.

FIG. 7 shows the upper portion of the process station of FIG. 6, in the closed position, with a wafer 48 held therein for processing. After the reactor has been closed, the helium bleed can be started through port 134. At the same time, desired process gasses can be provided through a process gas distributor 120.

In the presently preferred embodiment, the process gas distributor 120 is made of quartz, so that it does not pick up eddy currents from the rf power present. Moreover, since the surface of the quartz is highly insulating, the plasma boundary near the quartz will not have as much voltage nor as much current across it as the plasma boundary near a grounded conductive element would. This means that plasma-assisted reactions near the quartz will not occur at as high a rate as they would near a grounded conductive element, so that deposition is reduced.

It should also be noted that quartz is a fairly good thermal insulator, and the temperature of the susceptor may therefore be raised (by radiation from the plasma) to 100 or 200 degrees C. This is advantageous, since raising the temperature of the distributor will further reduce deposition on it.

Under the preferred operating conditions (10 to 100 microns of pressure, and 400 to 800 watts of applied power) the generated plasma will fill the chamber between powered electrode 118 and ground electrode 110 fairly uniformly. Thus, the gas distributor 120 protrudes into the densest part of the plasma. The gas distributor 120 is preferably a ring, of perhaps one-half the diameter of the wafer being processed, with hollow supports which lead down to gas connections 140 mounted in the base plate 138.

Preferably, a quick-connect mounting is provided for the quartz distributor 120, so it can rapidly and easily be changed out as desired.

The gas distributor 120 is, in the presently preferred embodiment, spaced away from the surface of the wafer by about four centimeters. This spacing, and the exact shape of the gas distributor 120, and the spacing of the ports 122 on the gas distributor, are none of them critical. These parameters can be changed if desired, but, if modified, they should be selected so that diffusion of process gasses and process gas products from the ports 122 in the gas distributor 120 provides: (1) diffusion-dominated transport of the process gasses and process gas products to the plasma boundary at the face of the wafer 48; and (2) a fairly uniform concentration of process gasses and process gas products at the plasma boundary next to the face of wafer 48. For example, the spacing of the distributor away from the wafer face could be anywhere in the range from one to fifteen cm.

Under these low pressure conditions, and given the high area ratio between the area of electrode 118 in contact with the plasma (which, in this embodiment, is essentially the same as the area of wafer 48), and the grounded electrode area (which in this embodiment is essentially the area of ground electrode 110, plus the interior area of chamber walls 112 and the exposed upper area of base plate 138), a high density of plasma bombardment will occur at the face of wafer 48. As is well-known to those skilled in the art, this ion bombardment assists in achieving desirable anisotropy effects during etching.

The ground plane electrode 110 is preferably cooled, using coolant lines 150 connected to manifold cavities inside the electrode 110. If additional cooling is needed, the walls 112 may also be cooled.

Note that lines 150 are preferably flexible hoses, to accomodate the vertical travel of the whole lower etching chamber (110, 112, 138, 120, 114) as described above. The gas supply tube 150, which supplies process gasses through connection 140 to the gas distributor 120, is preferably also flexible for the same reason. If flexure of these hoses is found to generate excess particulates, a gas feed outside the bellows 124, through the side of the base plate 138, could be used instead.

FIG. 8 shows a plan view of the reactor of FIG. 6. The shape of the gas distributor 120 can be seen more clearly in this plan view. It can also be seen that the base plate 138 includes substantial spaces around the edge of the ground electrode 110, which provide a passage from the gas feed ports 122 to a vacuum pump below.

The overall gas flow in this reactor is downward, away from the face of the wafer, which assists in reducing particulates.

After the desired etching operation has finished, gas supply through gas distributor 120 is cut off, and the process station 104 is pumped down to the same pressure as the rest of the process module (10 to the −5 Torr or less). A holding time may then be interposed, for thermal stabilization of the process station or for release of possible suspended particulates, and then the process station 104 is opened and the transfer arm assembly 106 operates as before to remove the wafer from it.

Thus, the present invention provides all of the advantages listed above, and others besides. The present invention can be very widely modified and varied, and its scope is not limited except as specified in the claims.

We claim:

1. A wafer transfer arm for transferring semiconductor wafers, comprising:
    an arm, extensible in a radial direction, and pivotable in an angular direction about an axis at right angles to the radius;
    support means at the distal end of the wafer transfer arm, wherein the support means is for supporting a wafer substantially by edge contact alone; and
    wherein the support means comprises:
        a plurality of pins substantially at right angles to the plane of a supported wafer.

2. The transfer arm of claim 1, wherein the plurality of pins is three pins.

3. The transfer arm of claim 1, wherein the plurality of pins is a plurality of tapered pins.

4. The transfer arm of claim 1, wherein each of the pins includes a small shoulder.

5. A wafer transfer arm for transferring semiconductor wafers, comprising:
    an arm, etensible in a radial direction, and pivotable in an angular direction about an axis at right angles to the radius;
    support means at the distal end of the wafer transfer arm, wherein the support means is for supporting a wafer substantially by edge contact alone; and
    wherein the arm is elevatable along said axis.

6. An arm for transferring semiconductor wafers, comprising:
    an arm, extensible in a radial direction, and pivotable in an angular direction about an axis at right angles to the radius;
    support means at the distal end of the arm, for supporting a wafer with an edge flat in a predetermined orientation with respect to the support means; and
    wherein the support means comprises a plurality of pins, at least one of which is positioned for making contact with said flat of said wafer to orient the wafer.

7. The arm of claim 6, wherein the plurality of pins is three pins, wherein one pin is for contacting said wafer flat and the other two pins are for contacting the curved edge of said wafer.

8. The Arm of claim 6, wherein each of the pins is tapered.

9. An arm for transferring semiconductor wafers, comprising:
    an arm, extensible in a radial direction, and pivotable in an angular direction about an axis at right angles to the radius;

support means at the distal end of the arm, for supporting a wafer with an edge flat in a predetermined orientation with respect to the support means;

wherein the support means includes means for supporting said wafer substantially by edge contact alone; and wherein said included means comprises a plurality of pins each having a small shoulder at its base.

10. A method for transferring semiconductor slices, comprising the steps of:

providing an arm, extensible in a radial direction, and pivotable in an angular direction about an axis at right angles to the radius;

providing support means at the distal end of the wafer transfer arm, wherein the support means is for supporting a wafer substantially by edge contact alone;

moving the support means under a wafer at a first location;

raising the arm along said axis until the wafer is supported by the support means alone; and translating the distal end of the arm to a second location to deposit the wafer.

11. The method of claim 10, wherein the wafer is deposited at the second location by lowering the arm along said axis until the wafer is lifted free of the support means.

12. A method of transferring semiconductor wafers, comprising the steps of:

providing an arm, extensible in a radial direction, and pivotable in an angular direction about an axis at right angles to the radius;

moving the distal end of the arm to a first location;

securing a wafer to the distal end by substantially wafer edge contact alone;

moving the distal end of the arm to a second location to transfer the wafer from the arm;

wherein the step of securing comprises:

moving the distal end under the wafer; and raising the distal end until support means on the distal end have supportingly lifted the wafer free of supports at the first location.

13. The wafer transfer arm of claim 5, wherein the support means comprises:

a plurality of pins substantially at right angles to the plane of a supported wafer.

14. The wafer transfer arm of claim 13, wherein the plurality of pins is three pins.

15. The method of claim 12, wherein the step of raising the distal end is carried out by elevating the arm along said axis.

16. The method of claim 12, further comprising the step of:

lowering the arm to transfer the wafer from the arm.

17. The method of claim 12, further comprising the step of:

providing that the wafer is face-down during the execution of all the steps.

18. The method of claim 12, further comprising the step of:

providing that the support means includes a plurality of pins substantially at right angles to the plane of a supported wafer.

* * * * *